US006817216B2

(12) United States Patent
Kou

(10) Patent No.: US 6,817,216 B2
(45) Date of Patent: Nov. 16, 2004

(54) ELECTRONIC COMPONENT PLACEMENT

(75) Inventor: Yuen-Foo Michael Kou, Andover, MA (US)

(73) Assignee: Accu-Assembly Incorporated, Reading, MA (US)

( * ) Notice: Subject to any disclaimer, the term of this patent is extended or adjusted under 35 U.S.C. 154(b) by 90 days.

(21) Appl. No.: 10/225,695

(22) Filed: Aug. 22, 2002

(65) Prior Publication Data

US 2004/0039480 A1 Feb. 26, 2004

(51) Int. Cl.[7] .............................. B60R 25/00; B62H 5/14
(52) U.S. Cl. ......................... 70/225; 700/213; 209/709
(58) Field of Search ................................. 700/213, 225;
29/740, 832, 700, 701, 709, 711

(56) References Cited

U.S. PATENT DOCUMENTS

| 3,967,994 | A |   | 7/1976  | Langberg         |        |
|-----------|---|---|---------|------------------|--------|
| 4,331,985 | A |   | 5/1982  | Tanaka           |        |
| 4,583,669 | A |   | 4/1986  | Sirkis           |        |
| 4,610,083 | A | * | 9/1986  | Campisi et al.   | 29/832 |
| 4,653,664 | A |   | 3/1987  | Hineno et al.    |        |
| 4,742,406 | A |   | 5/1988  | Turuda           |        |
| 4,756,012 | A |   | 7/1988  | French, III      |        |
| 5,191,693 | A |   | 3/1993  | Umetsu           |        |
| 5,289,625 | A |   | 3/1994  | Umetsu et al.    |        |
| 5,342,460 | A | * | 8/1994  | Hidese           | 156/64 |
| 5,472,153 | A |   | 12/1995 | Crowley et al.   |        |
| 5,515,600 | A |   | 5/1996  | Iwasaki et al.   |        |
| 5,553,376 | A | * | 9/1996  | Solanki et al.   | 29/833 |
| 5,713,125 | A | * | 2/1998  | Watanabe et al.  | 29/833 |
| 5,775,945 | A |   | 7/1998  | Bianca et al.    |        |
| 5,873,966 | A |   | 2/1999  | Goldberg et al.  |        |
| 5,938,890 | A | * | 8/1999  | Schlinkmann et al. | 156/541 |
| 5,976,250 | A |   | 11/1999 | Maetani et al.   |        |
| 6,027,019 | A |   | 2/2000  | Kou              |        |
| 6,097,427 | A |   | 8/2000  | Dey et al.       |        |
| 6,141,869 | A |   | 11/2000 | Crane, Jr. et al.|        |
| 6,157,870 | A |   | 12/2000 | Gfeller et al.   |        |
| 6,324,752 | B1|   | 12/2001 | Wesseling et al. |        |
| 6,530,517 | B1| * | 3/2003  | Kou              | 235/375 |
| 6,675,056 | B1| * | 1/2004  | Black et al.     | 700/116 |
| 6,694,606 | B1| * | 2/2004  | Ohashi et al.    | 29/740 |

FOREIGN PATENT DOCUMENTS

| EP | 0 335 582  | 10/1989 |
| JP | 2-135800   | 5/1990  |
| JP | 3-8655     | 1/1991  |
| JP | 3-133763   | 6/1991  |
| JP | 5-145283   | 6/1993  |

* cited by examiner

Primary Examiner—Khoi H. Tran
(74) Attorney, Agent, or Firm—Fish & Richardson P.C.

(57) ABSTRACT

A method is disclosed of associating a component source with a destination circuit board in a component placement machine equipped with a component carrier tape having a first portion positioned to deliver components for subsequent placement onto the destination circuit board and a second portion attached to the first portion by a splice. The method includes sequentially removing a plurality of components from the component carrier tape for subsequent placement onto a destination circuit board, beginning with the first portion of tape, scanning a section of the component carrier tape associated with each removed component using a scanner that is responsive to the splice and, finally, creating an association between the destination circuit board and the second portion of tape in response to the scanner detecting the splice.

38 Claims, 7 Drawing Sheets

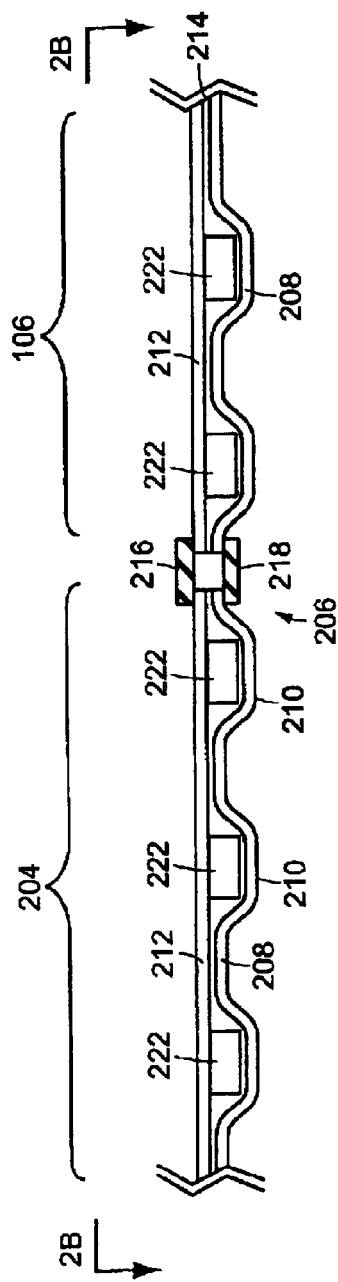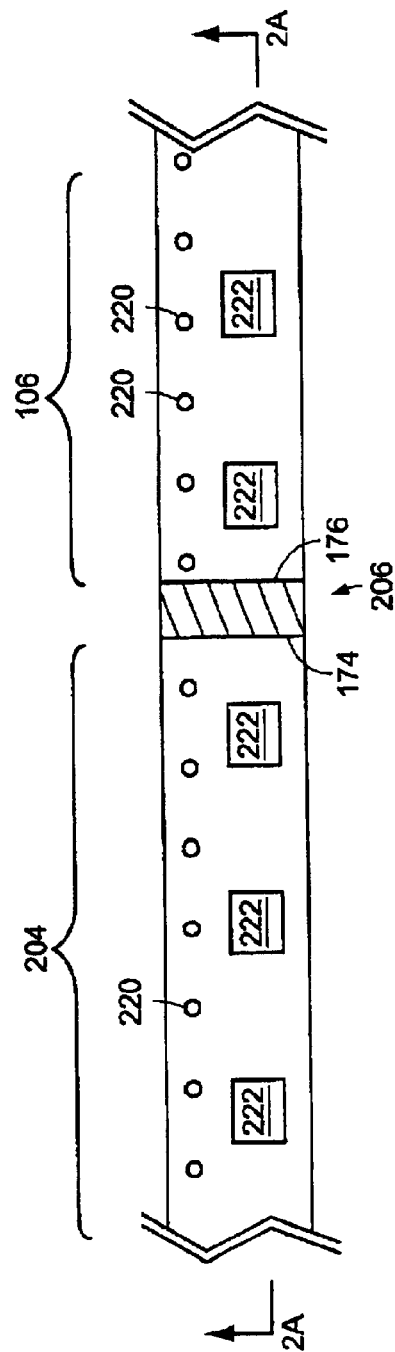

ELECTRONIC COMPONENT PLACEMENT

BACKGROUND

This invention relates to placing electronic components on circuit boards.

Electronic components can be supplied to component placement machines on carrier tapes spooled onto reels for removal by a pickup member and subsequent placement onto a destination circuit board. When the available inventory on a reel of component tape at a particular feeder is nearly exhausted, a machine operator might splice a leading end of a new component tape to the trailing end of the nearly exhausted tape, so that the machine will not run out of inventory and will continue to operate without interruption. Electronic component feeders, such as the one disclosed in Gfeller et al. (U.S. Pat. No. 6,157,870), have included a splice sensor for detecting a spice that connects two tapes together and for emitting, upon detection of that splice, a signal that allows for an automatic and synchronous take over of data associated with the connected tape.

Many component reels include a cover tape that overlays the components and is peeled away from the carrier tape before the components are picked from the carrier tape for assembly onto boards. In such cases, when splices are made, the carrier tape and the cover tape may both be spliced together at the connection.

SUMMARY OF THE INVENTION

One aspect of the invention features associating a component source with a destination circuit board in a component placement machine equipped with a component carrier tape having a first portion positioned to deliver components for subsequent placement onto the destination circuit board and a second portion attached to the first portion by a splice. The method includes sequentially removing a plurality of components from the component carrier tape for subsequent placement onto a destination circuit board, beginning with the first portion of tape, scanning a section of the component carrier tape associated with each removed component using a scanner that is responsive to the splice and, finally, creating an association between the destination circuit board and the second portion of tape in response to the scanner detecting the splice.

In certain embodiments, the scanner will be integral to a feeder to which the component carrier tape is coupled. In other embodiments, the scanner will be securely attached to a movable pick-head that is positionable to remove components from the component carrier tape. The scanner may be responsive to a property associated with the splice, for example, color, reflectivity, fluorescence, or even magnetic properties.

Additionally, in some cases, the method includes storing the identification data associated with the destination circuit board and the second portion of tape. A link can then be established between the identification data of the destination circuit board and the identification data of the second portion of tape. This link can be stored in a memory storage unit.

According to a second aspect of the invention, a method of tracking an association between a circuit board assembled with a component placement machine and a source identity of an electronic component of the circuit board includes coupling a first circuit board to the placement machine to receive an electronic component placed by the machine, mounting a reel loaded with a first length of component supply tape on the machine, attaching a leading end of a second length of component supply tape to a trailing end of the first length of component carrier tape with a splice connection, recording identities of the first length of tape, the second length of tape and the first circuit board, removing a component from the first length of tape and placing it on the first board, associating the identity of the first length of tape with the identity of the first board, detecting the splice connection, removing a component from the second length of tape for placement onto the first board and, finally, associating the identity of the second length of component carrier tape with the identity of the first board. In some cases, the method includes coupling a second circuit board to the machine to receive an electronic component placed by the machine, recording an identity of the second board, removing a component from the second length of tape for placement onto the second circuit board and associating the identity of the second length of tape to the identity of the second board.

The sequence of events may be modified in many ways as would be understood by one of skill in the art. For example, recording the identity of the first length of tape may occur before mounting the reel. Additionally, recording the identity of the second length of tape can occur before attaching the leading end of the second length of tape to the trailing end of the first length of tape. Furthermore, recording the identity of the first circuit board may be accomplished before coupling the first circuit board to the machine. Still further, removing the component from the first length of tape and associating the first length of tape with the first circuit board may occur before attaching the leading end of the second length of tape to the trailing end of the first length of tape. Also, associating the second length of tape to the first circuit board may occur in response to detecting the splice connection. Alternately, removing the component from the second length of tape after detecting the splice connection may trigger associating the second length of tape with the first circuit board.

In certain implementations the disclosed method includes associating the second length of tape to the first circuit board in response to placing a removed component from the second length of tape onto the first circuit board.

In some cases, the method includes activating an alarm or de-energizing the machine in response to detecting the splice connection if the identity of the second length of tape has not been recorded or has been recorded incorrectly.

Detecting the splice connection can be accomplished using a sensor that is integral to a feeder upon which the reel is mounted. Alternately, detecting the splice connection can be accomplished using a sensor that is securely fastened to a movable pickup member that is positionable for removing a component from the first length of tape and placing the removed component onto the first circuit board. Detecting the splice connection can include using an optical sensing element responsive to color to detect a color associated with the splice connection, or using an optical sensing element responsive to reflectivity to detect a reflectivity associated with the splice connection, or using an optical sensing element responsive to fluorescence to detect a fluorescence associated with the splice connection. Alternately, detecting the splice can include using a sensing element responsive to magnetism to detect a magnetic property associated with the splice connection.

According to yet another aspect of the invention, an apparatus includes a memory storage unit and a processing unit. The processing unit is configured to store in the memory storage unit identification data associated with a first circuit board, a first length of tape coupled to a placement machine to supply components thereto and a second length of tape having a leading end that is attached to a trailing end of the first length by a splice connection. The processor is also configured to create an association between the identification data of the second tape and the identification data of the first board in response to receiving a signal that indicates detection of the splice connection. In some instances, the recited apparatus includes a data entry device for receiving identification data associated with circuit boards and component carrier tape for processing in the processing unit and for storing in the memory unit. In some embodiments the processing unit is configured to store in memory data representing the association between the lengths of tape and the circuit boards. The processing unit can also be capable of creating the association after issuing an instruction to the placement machine to remove a component from the second length of tape for subsequent placement and after receiving the splice detection signal. The processing unit can also store in memory identification data associated with a second circuit board coupled to the placement machine and create an association between that data and the data associated with the second length of tape. The processing unit can also store the created association between the second length of tape and the second circuit board in a memory unit.

In still another aspect, a computer-readable medium stores computer executable instructions that cause a computer system to receive identification data associated with a first circuit board and identification data associated with a second length of tape that is attached to a first length by a splice connection. The instructions cause the computer system to store that identification data in a memory unit and to create an association between the first circuit board and the second length of tape in response to detecting a splice connection at the tape.

Some implementations include instructions that cause the computer system to store the created association. In some implementations the instructions also cause the computer system to store identification data associated with a second circuit board that is coupled to the placement machine and to create an association between the second circuit board and the second length of tape. Additionally, in some implementations, the instructions can cause the computer system to store the created association.

According to still another aspect, a method of managing inventory data associated with an electronic component placement machine having a pick-up member and a plurality of feeder positions includes removing an electronic component from a feeder at a selected one of the feeder positions with the pick-up member for subsequent placement on a circuit assembly. The method also includes scanning a portion of a component carrier tape associated with the selected feeder position using a scanner secured to the pick-up member. Additionally, the method includes determining whether the scanned portion of the component carrier tape includes a splice.

In some embodiments, the method also includes placing the removed electronic component on the circuit assembly, removing a second electronic component from the feeder and scanning a second portion of the component carrier tape for a splice, the second portion of the carrier tape spaced from all previously scanned portions. In some embodiments, the recited method also includes placing the removed electronic component on the circuit assembly, removing a second electronic component from a second feeder with the pick-up member, scanning a portion of a component carrier tape associated with the second feeder using the scanner secured to the pick-up member and determining whether the scanned portion of the component carrier tape associated with the second feeder includes a splice. Furthermore, in some implementations, the method includes, after scanning the portion of the component carrier tape, advancing the component carrier tape. Data associated with a particular feeder position that is stored in an inventory management database can also be verified and/or updated upon detection of a splice. A signal can be generated to indicate that the scanned portion of component carrier tape includes a splice. In certain situations, the method includes incrementing a value stored in a memory device responsive to the generated signal, where the stored value indicates the remaining inventory of electronic components available at the selected feeder position. Certain implementations will include, verifying, in response to the generated signal, that component identification data is updated in an inventory control database associated with the electronic component placement machine. In certain implementations, the placement machine will be de-energized in response to the generated signal and a determination that component identification data is not updated. Furthermore, in such a case, an alarm can be activated as well.

Some implementations include detecting a particular property of the scanned portion of the component carrier tape with a scanner that has an optical sensing element responsive to color, reflectivity or fluorescence. Alternately, the scanner can have a sensing element responsive to magnetism. Certain implementations include scanning a base portion of the component carrier tape or a separable cover portion of the component carrier tape.

According to another aspect, an electronic component placement machine includes a series of feeder slots adapted to receive and hold electronic component feeders containing discrete electronic components carried in spaced relation on carrier tapes, a circuit board holder, a pick head movable between selected feeder slots for sequentially picking the discrete electronic components from their respective feeders and transporting them to the circuit board holder for placement, and a splice detector secured to the pick head for movement therewith between feeder slots. The splice detector is arranged to be functionally directed toward a selected region of the carrier tape of a selected feeder from which the pick head is positioned for picking a component. In certain embodiments, the splice detector is operable to detect a splice at the selected region of the carrier tape.

In some embodiments, the electronic component placement machine includes an inventory management database for storing data associated with the discrete electronic components available at each feeder slot. Such data can include, for example, an available inventory value associated with each feeder position, which value is typically updated each time the pick head picks a discrete electronic component from the particular feeder position. The available inventory value can be decremented, for example, each time the pick head picks a discrete electronic component from an associated feeder position as long as the splice detector does not detect a splice at the selected region of the carrier tape. Additionally, the available inventory values can be replenished each time the splice detector detects a splice at the selected region of the carrier tape.

Certain implementations include an inventory management database for storing component identification data associated with the discrete electronic components available at each feeder slot. Certain placement machines also include a verification unit, wherein, upon detection of a splice by the splice detector, the verification unit verifies that the component identification data has been properly updated. Particular embodiments include an alarm that is operable in response to the splice detector detecting a splice.

The splice detector can include an optical sensing element responsive to a color, reflectivity, fluorescence, or other property associated with a splice on the carrier tape. Alternately, the splice detector can include a sensing element responsive to a magnetic property associated with a splice. Additionally, the splice detector can be functionally directed toward either a base portion of tape or a removed cover portion of tape.

Certain placement machines include a signal generator that can generate a signal in response to the splice detector detecting a splice.

According to yet another aspect, an electronic component placement machine has a plurality of electronic component feeder positions and includes a pick-up member positionable to remove an electronic component from a component carrier tape at a selected one of the plurality of feeder positions and a scanner secured to the pick-up member. The scanner is positionable to scan a portion of the component carrier tape associated with the selected feeder position, and is responsive to a splice on the scanned portion of the component carrier tape. The placement machine also typically includes a mechanism for advancing the component carrier tape after the portion of the component carrier tape is scanned.

In some cases, the recited placement machine includes an inventory management database for storing data associated with the electronic components accessible at each of the feeder positions. The inventory management database can store values representing the remaining inventory of electronic components available at each feeder position. Additionally, the values can be automatically updated upon detection of a splice on the component carrier tape to indicate availability of additional electronic components at selected feeder locations.

In certain implementations, the placement machine includes a verification unit that can verify that the component identification data associated with the feeder positions is properly updated upon detection of a splice. In certain instances, the placement machine can also include an alarm that is operable in response to the scanner detecting a splice on the component carrier tape.

The scanner can include an optical sensing element responsive to a color, reflectivity or fluorescence associated with a splice connection. Alternately, the scanner can include a sensing element responsive to a magnetic property associated with the splice connection. The scanner can be positionable to scan either a base portion of the carrier tape or a cover portion of the carrier tape. In some implementations, the placement machine can include a signal generator that generates a signal in response to the scanner detecting a splice on the scanned portion of the component carrier tape.

Aspects of the invention can provide improved traceability to component sources associated with a circuit board manufactured by a component placement machine. This improved traceability may provide, for example, a simpler way to recall a large number of circuit boards "infected" by a component supplied from a defective reel of carrier tape. Such facilitated recall capability may be especially desirable in many industries such as medical, avionics, automotive, military, etc. where, for example, product liability is a significant concern or where proper operation of equipment is particularly crucial.

Additionally, the detection of splices in a component placement machine equipped with a plurality of component carrier tapes may be simplified, for example, by utilizing a single detector secured to a movable pickup member. Implementing such techniques may significantly reduce the number of hardware components that a placement machine uses and simplify the interconnections between those components, ultimately resulting in lower manufacturing costs associated with the component placement machine. Implementing such techniques may also facilitate troubleshooting of operational problems associated with a placement machine. Furthermore, maintenance costs may be reduced, and placement machines may operate more efficiently.

Improvements and simplifications may also be realized in the process of verifying that a spliced length of tape contains correct components mounted thereon for a particular application. Furthermore, other improvements and simplifications of functions related to splice detection may also be realized.

Other features and advantages will be readily apparent from the following detailed description, the accompanying drawings and the claims.

BRIEF DESCRIPTION OF THE DRAWINGS

FIGS. 2A and 2B illustrate a cutaway elevation view of a component carrier tape and a plan view of the component carrier tape, respectively.

DETAILED DESCRIPTION OF THE DRAWINGS

Figure 1:
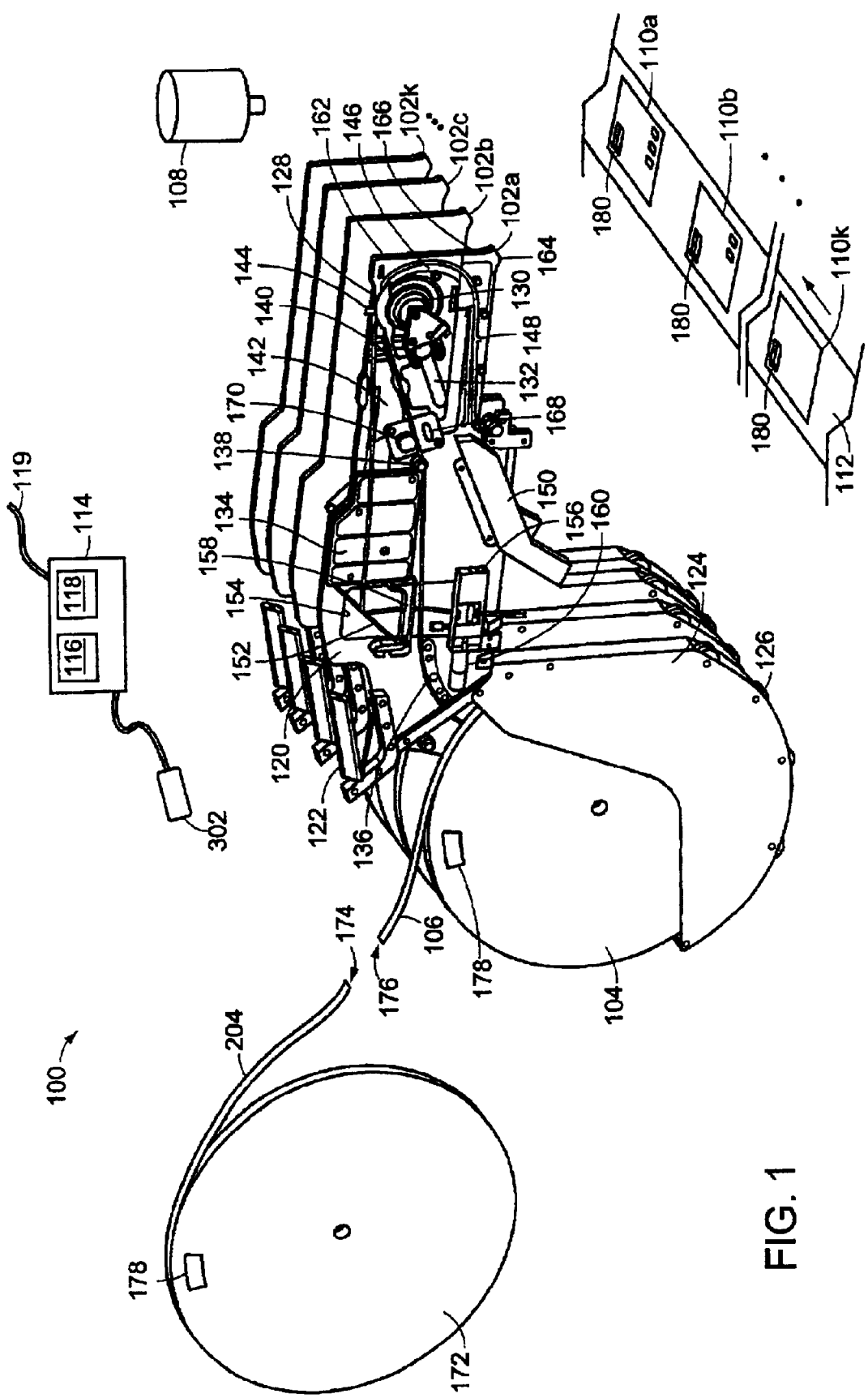
FIG. 1 illustrates a component placement machine.

FIG. 1 illustrates an electronic component placement machine 100 including a series of electronic component feeders 102a, 102b, 102c . . . 102k positioned within corresponding feeder slots (not shown). Each feeder 102a, 102b, 102c . . . 102k contains a reel, for example reel 104, loaded with a length of component carrier tape, for example, length 106 having discrete electronic components mounted thereon. The component placement machine 100 also includes a component pickup member 108 that is movable in such a manner that it can pickup components from a selected one of the plurality of available component carrier tapes for subsequent placement upon a destination circuit board, for example, one of either 110a, 110b . . . 110k. The electronic component placement machine 100 also includes a circuit board positioning mechanism 112, which, in the illustrated embodiment is a conveyer belt upon which circuit boards 110a, 110b . . . 110k are positioned.

A computing device 114, containing a processing unit 116 and a memory storage unit 118, is coupled to the component placement machine 100 via communication link 119 for processing and storing various data related to machine 100 operations. A data entry device 302 is coupled to the computing device 114 to enable a machine operator to enter various data associated with reels and circuit boards that are processed by the machine 100.

A second reel 172 contains a second length 204 of tape having an exposed leading end 174 that is suitable for attaching to the exposed trailing end 176 of the first length 106 from reel 104 with a splice connection. A reel identification label 178 is attached to each reel for example, reels 104 and 172. Additionally, a circuit board identification label 180 is attached to each circuit board 110a, 110b . . . 110k. The component placement machine 100 is particularly well suited for recording and storing data that can link each circuit board 110a, 110b . . . 110k processed by the machine 100 to a set of associated source component reels, for example, reel 104, that supply components to those circuit boards.

Electronic component feeder 102a includes a base plate 120 provided with a handle 122. Reel cassette 124 is secured to the base plate 120 and opens upward. Reel 104 is resting within the reel cassette 124 and is freely rotatable within the cassette 124 on a plurality of rollers 126 positioned at the lower part of the reel cassette 124. The illustrated design provides for a fairly simple method of removing a particular reel, for example, reel 104 from its associated cassette 124 for the purpose of splicing a length of tape from a new reel, for example, length 174 from reel 172 to the original length 106 of tape and installing the new reel 172 into the cassette 124 without having to remove the feeder 102a itself or having to interrupt operation of the placement machine 100.

FIGS. 2A and 2B illustrate a component carrier tape comprising a first length 106 connected to a second length 204 by a splice connection 206 disposed there between. The component carrier tape includes a supply tape portion 208 having a plurality of pockets 210 positioned along the length of the carrier tape. Each pocket 210 can contain an electronic component 222 for subsequent positioning upon a destination circuit board such as circuit boards 110a, 110b . . . 110k. A removable cover tape portion 212 is secured to the supply tape portion 208 by an adhesive material 214 to cover each pocket 210.

The splice connection 206 typically includes an adhesive material such as adhesive tape and may have a particular characteristic that is detectable by splice detector 142. For example, the splice connection 206 may exhibit a particular color, reflectivity, and/or fluorescence. Alternatively, the splice connection 206 may exhibit particular magnetic properties. Preferably, the splice connection 206 includes splice material extending substantially around the perimeter of the component carrier tape at the splice location. However, as a minimum, the splice connection 206 should include at least a top portion 216 connecting the cover tape portion 212 of the first length 106 of tape to the cover tape portion 212 of the second length 204 of tape and a bottom portion 218 connecting the supply tape portion 208 of the first length 106 of tape to the supply tape portion 208 of the second length 204 of tape. The supply tape portion 208 is typically a Mylar material and the cover tape portion 212 is typically either paper or a molded plastic, but other materials also may be suitable as well. A plurality of tape perforations 220 are positioned along the length of the component carrier tape 106 at approximately equal intervals for mating with a carrier tape drive unit, for example, drive unit 130.

Referring again to FIG. 1, the first length 106 of tape passes from reel 104, through a central part of the feeder 102a and to a front part of the feeder 102a, where, at a pickup position 128, the pickup member 108 can remove a component from the length 106 of tape. The pickup member 108 is positionable to remove a discrete electronic component 222 from the pickup position 128 of any selected one of the available feeders 102a, 102b, 102c . . . 102k and for depositing the thus removed electronic component 222 upon a destination circuit board for example, one of either 110a, 110b or 110k. The pickup member 108 is typically mounted on a movable mechanical limb (not shown). The pickup member 108 may use any technique known in the art for removing the component 222, such as, using vacuum sources, mechanical gripping elements or adhesives materials. In a typical embodiment, a single pickup member 108 can sequentially remove discrete electronic components 222 from a plurality of available feeders 102a, 102b, 102c . . . 102k.

A transport gear 130 is located below the pickup position 128 and is driven by a drive motor 132. The transport gear 130 is designed to engage the component carrier tape 106, for motion, using teeth on the gear 130 to engage corresponding perforations 220 in the tape 106. The tape 106 is transported in steps, which is controlled by an electronic control unit 134. Guidance of the tape 106 from the reel 104, to the transport gear 130 is effected via a slightly bent, first guide element 136, a comer pulley 138 and a first guidance channel 140. A splice detector 142 is disposed between the comer pulley 138 and the entrance to the first guidance channel 140.

As the tape 106 advances through the feeder 102a, but prior to it reaching the pickup position 128, the cover tape portion 212 is removed from the supply tape portion 208 by a pull-off device 144. After advancing beyond the pull-off device 144, the supply tape portion 208 continues to the pickup position 128. Beyond the pickup position 128, the supply tape portion 208 passes around the transport gear 130 through a curved, second guidance channel 146 and then through a substantially straight, third guidance channel 148. The supply tape portion 208 is then directed downward and out of the feeder 102a by a further guidance element 150.

Beyond the pulloff device 144, the removed cover tape portion 212 passes, without any further guidance, past the control unit 134 to a deflector shaft 152 and is there deflected downward. At the deflector shaft 152, the cover tape portion 212 is also turned 90 degrees from the tape axis so that the surface of the cover tape portion 212 is orientated roughly parallel to the base plate 120. The combined deflection and turning of the cover tape portion 212 is achieved by the deflector shaft 152 that is lying in the plane of the removed cover tape portion 211 and by the deflector shaft 152 enclosing an angle of around 45 degrees with the direction of travel of the cover tape portion 212.

The deflector shaft 152 is positioned adjacent to the base plate 120 so that the cover tape portion 212 can be placed easily around the deflector shaft 152 and guided below the deflector shaft 152 safely past the component carrier tape 106 also running past there. A recess 154 is provided in the base plate 120 adjacent the deflector shaft 152 and in the area between the deflector shaft 152 and drive unit 156. The cover tape portion 212 is led past the component carrier tape 106 in its orientation turned through 90 degrees. A guide element 158 is provided to guide the cover tape portion 212 in the recess 154. The guide element 158 has roughly the shape of a stationary stirrup positioned laterally to the direction of motion of the cover tape portion 212.

The cover tape portion 212 is transported (i.e., pulled) by the drive unit 156, which is driven by a separate drive motor 160. In certain implementations, the cover tape portion 212 may be collected onto a take up reel (not illustrated). The drive unit 156 is positioned below the guide element 158 at the lower edge of the recess 154. The drive unit 156 for the cover tape portion 212 lies in the tape plane, i.e., the drive axle is parallel to the tape plane or to the base plate 120. To insert the cover tape, a flipup top part can be opened and then closed again in a known manner on the drive unit 156.

The feeder 102a can be inserted into the placement machine 100 by means of the handle 122 with its front section, in which the transport gear 130 is positioned, mating with a corresponding mount (not shown) in the placement machine 100. A guide pin 162 at the top and a guide nose 164 located on the bottom side of the feeder 102a serve to guide and center the feeder 102a within the placement machine 100. A connection to the placement machine 100 for the exchange of electrical signals is created by a multiple plug contact 166 positioned between the guide pin 162 and the guide nose 164.

The splice detector 142 could include an optically operating transmitted-light sensor. In such an embodiment, the detector 142 might consist of an optical transmission unit 168 equipped with light emitting diodes (LEDs) or the equivalent and an optical receiving unit 170 opposing the transmission unit 168. The optical receiving unit 170 may be equipped with photosensitive elements such as photodiodes or the equivalent. The placement machine 100 is configured so that the tape 106 passes between the transmission unit 168 and the receiving unit 170 in such a way that any changes in the light transmitted there between can be detected and a corresponding electronic signal can be generated and made available for further processing. Alternately, the splice detector 142 could include an optical sensing element responsive to changes in color, reflectivity and/or fluorescence. It is also conceivable that the splice detector 142 could include a sensing element responsive to a magnetic property associated with a particular splice material. In an alternative embodiment, the splice detector 142 could be positioned external to the feeder 102a, for example, and, as discussed below in further detail, attached to the pickup member 108.

As mentioned above, the circuit board positioning mechanism 112 may be a conveyer belt that can position any one of a plurality of circuit boards 110a, 110b . . . 110k to receive electronic components placed there upon. Various other circuit board positioning mechanisms may be suitable for use as well, such as, for example, trays, robotic arms, etc. It is generally desirable that a circuit board positioning mechanism be capable of positioning one of a plurality of available circuit boards, such as circuit boards 110a, 110b . . . 110k into a receiving position quickly, reliably and easily.

Figure 3:
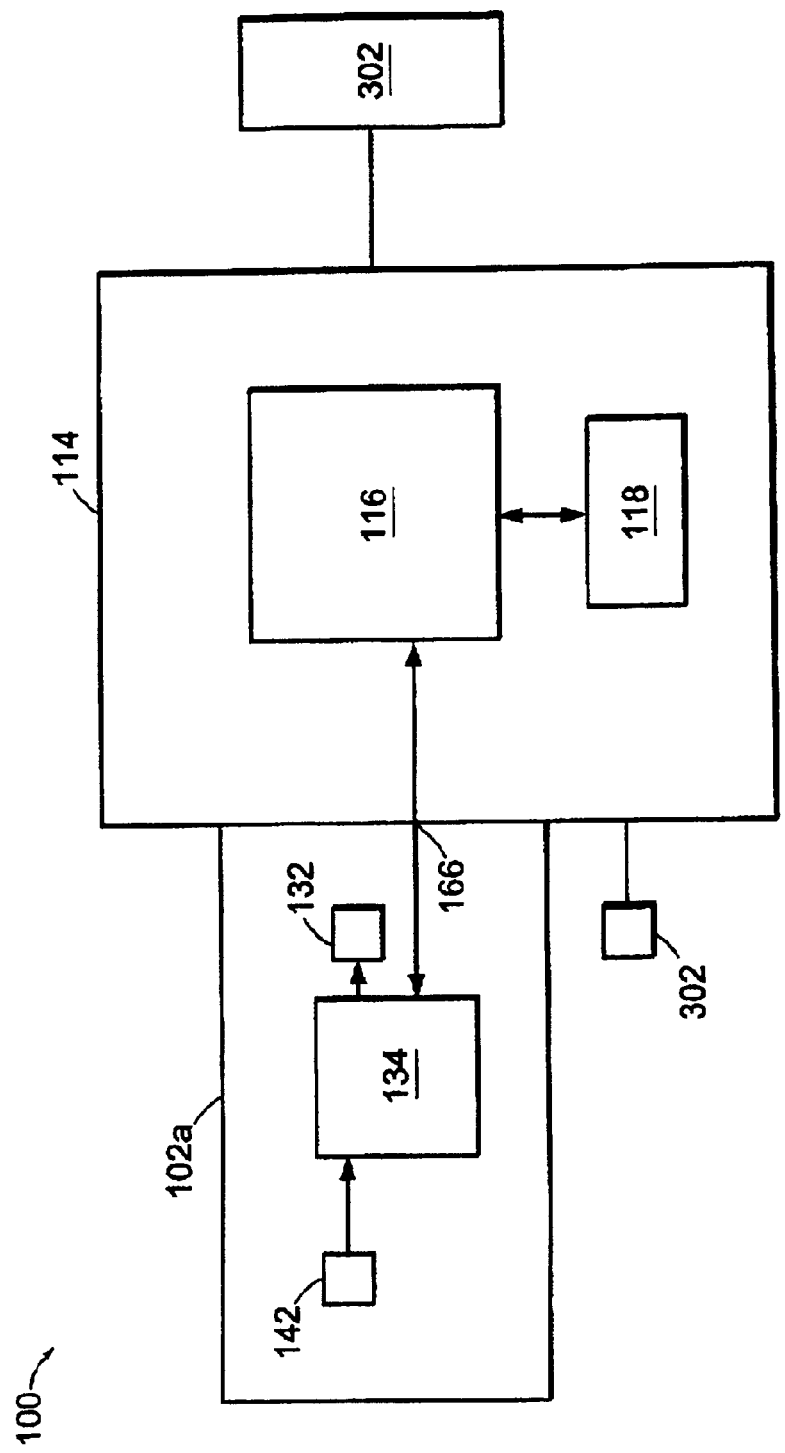
FIG. 3 illustrates a system block diagram.

Referring now to the block diagram of FIG. 3, an electronic component feeder 102a is coupled to a computing device 114 of an electronic component placement machine 100. In certain implementations, however, the computing device 114 may be situated at a location that is remote from the electronic component placement machine 100. The feeder 102a is electrically coupled, via plug contact 166, to allow the exchange of data between the local electronic control unit 134 of the feeder 102a and the processing unit 116 of the computing device 114. The splice detector 142 is connected to the electronic control unit 134 directly, however, it is also imaginable that the splice detector 142 could be connected directly to the processing unit 116 via the plug contact 166. Furthermore, a memory storage unit 118 is coupled to the processing unit 116.

Data entry device 302 is coupled to the computing device 114. The data entry device 302 enables the entry of identification data associated with each component carrier tape and the components located thereon for storage in the memory storage unit 118. The data entry device also enables the entry of identification data associated with circuit boards that are processed by the placement machine. The data entry device 302 may be, for example, a keyboard, a hand-held scanner, or some other automated data entry apparatus. The identification data may be applied to a reel of components in the form of a barcode strip, such as, for example, a bar code label discussed in U.S. Pat. No. 6,027,019, which is hereby incorporated in its entirety by reference. If a bar code strip or label is affixed to a reel, the data entry unit 302 may be designed as a barcode reader. Other methods of data entry are also imaginable.

A remote data storage unit 304 is illustrated. In certain embodiments it may be desirable to transfer data from either the electronic control unit 134 or the computing device 114 to a remote data storage unit 304 for long-term storage or further analysis, etc.

When a first reel of component carrier tape, for example reel 104, is coupled to a feeder, for example feeder 102a, identification data associated with reel 104 and the components mounted thereon may be entered via the data entry unit 302, into the memory storage unit 118. Typically, the electronic control unit 134 controls the drive motor 132 on the feeder 102a in response to commands issued by the processing unit 116, and those commands may be based, at least partially, on data stored in the memory storage unit 118. The tape is transported past the pickup position 128 in steps and the pickup member 108 can sequentially pickup a component from each pocket 210 of the tape 106, as required, for subsequent placement upon a destination circuit board.

Figure 4:
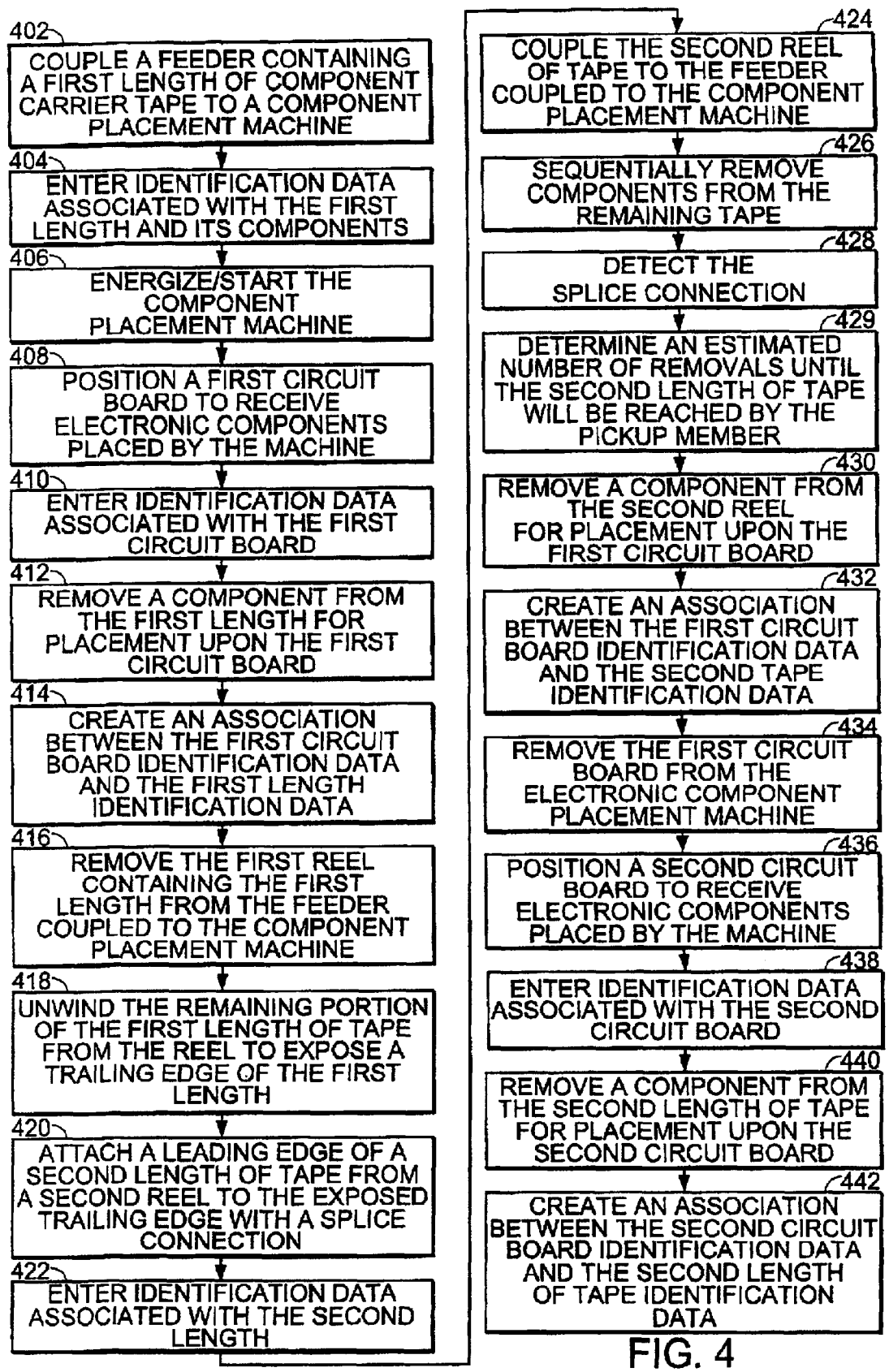
FIG. 4 is a flow diagram for creating associations between an electronic component source and a destination circuit board.

FIG. 4 illustrates a particular sequence of events that is modifiable in both order and in substance in ways that will be readily understood by one of sufficient skill in the art. According to the exemplary sequence, an electronic component placement machine operator initially couples 402 a feeder (e.g., feeder 102a) with a reel (e.g., reel 104) containing a first length 106 of electronic component carrier tape to a component placement machine 100. The operator then enters 404 identification data associated with the length 106 of component carrier tape and the components 222 mounted thereon for storage in a memory storage unit 118 and for use by the machine 100. Typical reel/tape component identification data includes, for example, component model numbers, serial numbers, manufacturing lot numbers, date of manufacture, location of manufacture, number of available components stored upon the tape, etc. After entering this data, the operator energizes or starts 406 the machine by turning on its power. A first circuit board, for example circuit board 110a, is then positioned 408 (i.e., coupled to the machine 100) to receive electronic components 222 placed by the placement machine 100. Such positioning may be accomplished by an automatic positioning mechanism 212 or by the operator, manually. Identification data associated with the first circuit board 110a is then entered 410. This may be accomplished, for example, either by an operator entering the data manually or by an automated data entry mechanism. Circuit board 110a identification data may include, for example, model numbers, serial numbers, etc. As each circuit board is sequentially advanced to an appropriate position in the placement machine 100 to receive components, circuit board identification data can be entered into the memory storage unit 118 via the data entry device 302.

During operation, the electronic component placement machine 100 may eventually remove 412 an electronic component 222 from the first reel 104 of component carrier tape 106 for placement upon the first circuit board 110a. The processing unit 116 then creates 414 an association between the first circuit board identification data and the first reel identification data and then stores that data for example, in the memory storage unit 118. The association may be created by either the local electronic control unit within the associated feeder 102a, or by the processing unit 116 within the computing device 114. Alternately, the association can be stored in a remote data storage unit 304.

As the electronic component placement machine 100 continues to operate, eventually, the number of available components on the first length 106 of tape on reel 104 may diminish significantly. If such a condition arises, the operator may decide to or be prompted to reload components at the associated feeder position. The operator may accomplish this by splicing a second length of tape, for example length 204, from a second reel 172, to the original length 106 of tape from the first reel 104 without shutting down the component placement machine 100. To do this, the operator removes 416 the first reel 104 of component carrier tape from the feeder 102a. The operator then unwinds 418 the remaining portion of the first length 106 of tape from the reel 104 to expose a trailing end 176 of the first length 106 of tape. Next, the operator attaches 420 a leading end 174 of the new length 204 of tape from the second reel 172 to the exposed trailing end 176 with a splice connection 206. Subsequently, the operator enters 422 identification data associated with the second length 204 of tape from reel 172 via the data entry device 302 for storage in memory storage unit 118. The operator then couples 424 the second reel 172 to the original feeder 102a that is mounted to the component placement machine 100. This may all be beneficially accomplished without having to interrupt the ongoing placement process.

As the remaining portion of the first length 106 of tape and the attached second length 204 of tape advance together through the machine 100, the pickup member 108 sequentially removes 426 components from each of the pockets 210 on the remaining portion of the first length 106 of tape. As the tape advances, eventually, the splice detector 142 detects 428 the splice connection 206. After the splice connection 206 is detected, the processing unit 116 determines the number of removals remaining until the pickup member 108 will reach a component 222 on the second length 204 of tape. This may be necessary if, for example, the splice detector is positioned to scan a portion of the first length 106 of tape that is located some distance away from the pickup position 128. In the illustrated embodiment, the number of removals remaining may be a fixed number. However, that may not always be the case and determination might require consideration of a variety of factors including, for example, the distance between components 222 on the first length 106 of tape and/or the size of those components 222. Based on the determination made, when the pickup member 108 eventually removes 430 a component from the tape of the second reel 172 for placement upon the first circuit board 110a, the processing unit 116 creates 432 an association between identification data associated with the first circuit board and identification data associated with the second length 204 of tape stored in the memory storage unit 118.

After the component placement machine 100 finishes placing components onto the first circuit board 110a, the first circuit board 110a is removed 434 from the component placement machine 100 by the circuit board positioning mechanism 112. Alternately, this may be accomplished manually or automatically by some other mechanism.

Subsequently, either an operator or an automatic positioning mechanism positions 436 a second circuit board, for example circuit board 110b, to receive an electronic component 222 placed thereupon by the machine 100. The operator, or an automatic mechanism, then enters 438 identification data associated with the second circuit board 110b via data entry device 302. Once the second circuit board 110b is in position, the pickup member 108 removes 440 a component 222 from the second length 204 of tape for placement upon the second circuit board 110b. The processing unit 116 then creates 442 an association between the identification data associated with the second circuit board 110b and the identification data associated with the second length 204 of tape.

Figure 5:
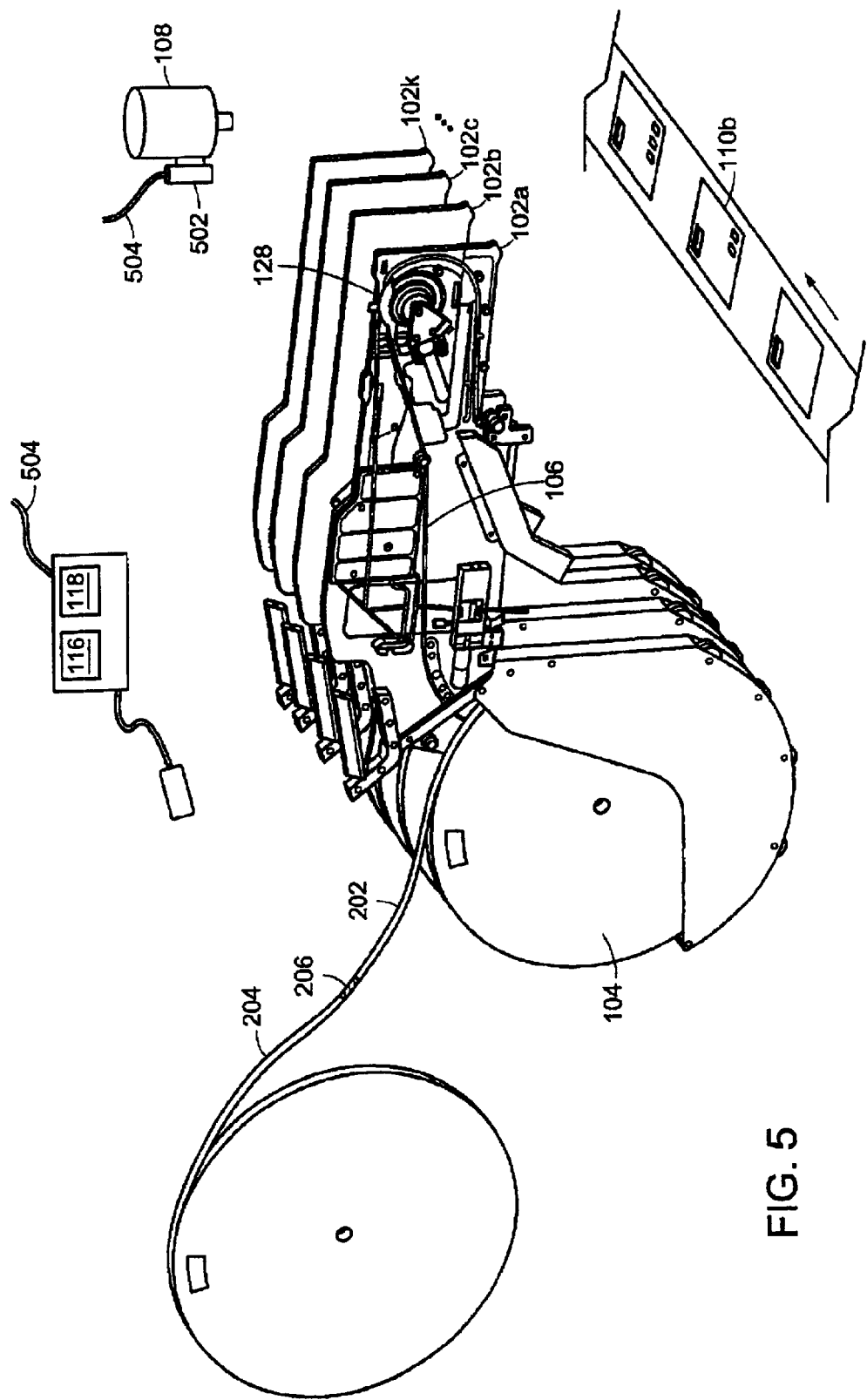
FIG. 5 illustrates a component placement machine having a splice detector secured to a pickup member.

FIG. 5 illustrates an arrangement that is similar in many respects to the arrangement of FIG. 1. One notable difference, however, is that FIG. 5 shows a splice detector 502 securely fastened to the pickup member 108 for motion therewith. The splice detector 502 is arranged so that it will be functionally directed toward a selected region of the component carrier tape 106 near the pickup position 128 of a selected feeder (e.g., one of either 102a, 102b, 102c . . . 102k) from which the pickup member 108 is positioned to remove component from. The splice detector 502, as shown, is oriented in such a manner that it can scan an area of the component carrier tape 106 that is upstream of the pickup position 128. Preferably, the splice detector 502 will be oriented to scan an area of the component carrier tape 106 that is close to the pickup position 128, for example, within approximately 20 millimeters. Alternately, the splice detector 502 may be oriented so as to scan an area of the component carrier tape 106 that is downstream of the pickup position 128 or to scan a portion of the pickup position 128 proper. As discussed herein, the splice detector 502 generally includes a sensing element that is responsive to a particular property associated with a material suitable for splicing component carrier tape, for example, a particular color, reflectivity, fluorescence or magnetic property. The splice detector 502 can communicate with the computing device 114 over a duplex communication channel 504, which may include, for example a hardwired connection or a wireless communication link.

Detecting a splice connection 206 using the splice detector 502 secured to the movable pickup member 108 can trigger and enable several functions. For example, if the splice detector 502 detects a splice connection 206 between a first length 106 of tape and a second length 204 of tape, the identification data associated with each length of tape stored in the memory storage unit 118 may then be read out by the processing unit 116 and subsequently compared to each other. If the data agree in a predetermined manner, which provides insurance that the spliced second length 204 of tape is correct for the particular application, the data associated with the second length 204 of tape may be released for use by the placement machine 100 and processing of the second length 204 of tape may be allowed to proceed. If a lack of agreement is found, this lack of agreement may be signaled to the operator as a warning and further processing of the second tape may be suspended. In this way, reloading correct components can be ensured without reducing production efficiency. Additionally, as discussed in detail above with reference to FIG. 4, in response to the detection of a splice connection 206, the electronic component placement machine 100 could create an association between a new, spliced length 204 of tape and a destination circuit board, such as 110a, 110b . . . 110k coupled to the machine 100 for placement thereon in response to the detection of a splice connection 206.

Figure 6:
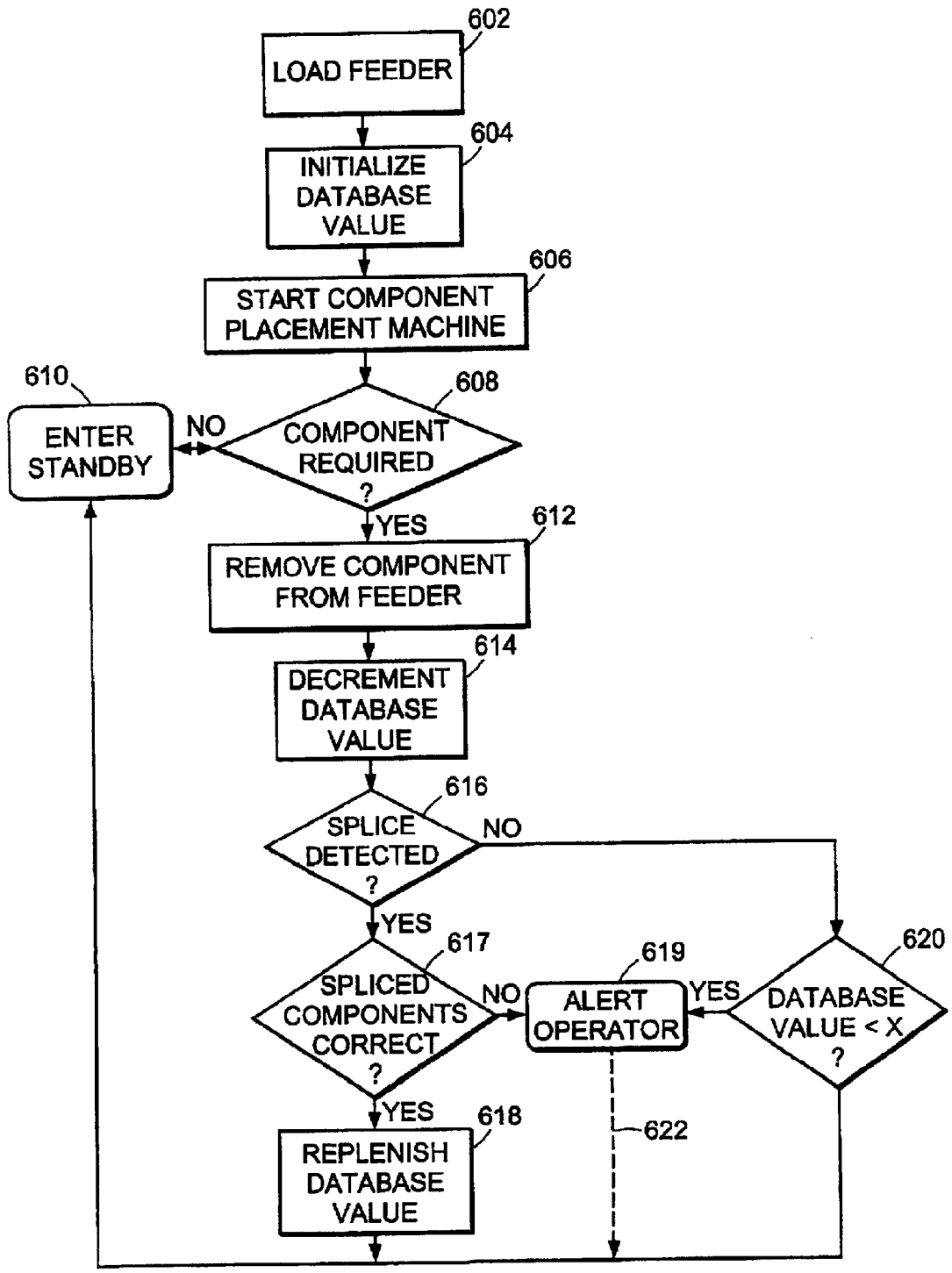
FIG. 6 is a flow diagram for managing inventory data associated with a component placement machine.

Referring now to FIG. 6, it should be understood that the memory storage unit 118 might include a database for storing data indicating the real-time available inventory at each feeder location. It should also be understood that the exemplary sequence of events detailed may be modified in either substance or order in ways that would be readily understood by one possessing sufficient skill in the art. As depicted, a placement machine operator loads 602 a feeder, such as feeder 102a, onto the placement machine 100. Next, the processing unit 116 initializes 604 the available inventory data value associated with feeder 102a. In most instances, the initialization value will be the total inventory available on a new feeder 102a. However, in some cases, the feeder 102a may have been partially used before being loaded and may not actually contain a full complement of components. To account for such a possibility, the processing unit 116 may access a stored value in the memory storage unit 118 or some other, perhaps, centralized database to obtain a value representing the actual number of components available at the feeder 102a. This value may be stored according to an identification code that is uniquely assigned to each particular reel of tape, for example, reel 104.

Next, the operator starts 606 the component placement machine 100. The processing unit 116 determines 608 whether a component from the loaded feeder 102a is required for placement. If no component is required, the feeder enters 610 a standby mode until a component is required. When that time comes, a pickup member, such as pickup member 108, removes 612 a component from the feeder 102a for subsequent placement upon a destination circuit board. At that time, the processing unit 116 decrements 614 the available inventory value stored in the memory storage unit 118 associated with reel 104.

The processing unit 116 then considers 616 whether the splice detector 502 detected a splice at a scanned portion of component carrier tape at feeder 102a. If a splice was detected, the processing unit 116 then compares data associated with the spliced second length 204 of tape to data associated with the original length 106 of component carrier tape to determine 617 whether the new tape is carrying the correct components. If the spliced second length 204 of component carrier tape is correct, the processing unit 116 replenishes 618 the available inventory value associated with feeder 102a that is stored in the memory storage unit 118. If, on the other hand, the spliced second length 204 of component carrier tape is determined to be incorrect, the processing unit 116 alerts 619 the operator. This alert may include, for example, activating an audible or visual alarm, entering an inventory order request, or perhaps even de-energizing the machine 100. When alerting the operator, the processing unit 116 may also identify to the operator the location (i.e., the feeder slot) of the incorrectly spliced carrier tape. The processing unit 116 may determine the location, for example, by noting which feeder slot the pickup member 108 was picking from when the alert was issued. Alternately, a bar code scanner may be secured to the pickup member 108 in a manner that allows it to scan a bar code label affixed to the feeder or feeder slot. If this arrangement is utilized, the bar code label may include location information that the scanner can transmit to the processing unit 116. Alternately, an encoder may be used to identify the position of the pickup member 108 when the alert is issued. Other devices and techniques known in the art may be used to identify the location of an incorrectly spliced component carrier tape.

If the processing unit 116 determines that no splice was detected, the processing unit 116 may then check 620 whether the available inventory value associated with the feeder 102a has dipped below some predetermined value "X." The value set for "X" may be any value, for example, "one," "ten" or "fifty." The value of "X" will usually be set by an operator to a particular value depending on the specific implementation. If the value has dipped below "X," the processing unit 116 alerts 619 the operator. As indicated by the dashed line 622, the machine 100 may or may not enter standby mode after alerting the operator. In most instances, however, the machine 100 will most certainly enter 610 standby mode after replenishing 618 the database value or after determining 620 that the database value has not dipped below the value "X." Other functions known in the art may also be performed in response to the splice detector 502 detecting a splice connection 206 at the component carrier tape.

Figure 7A:
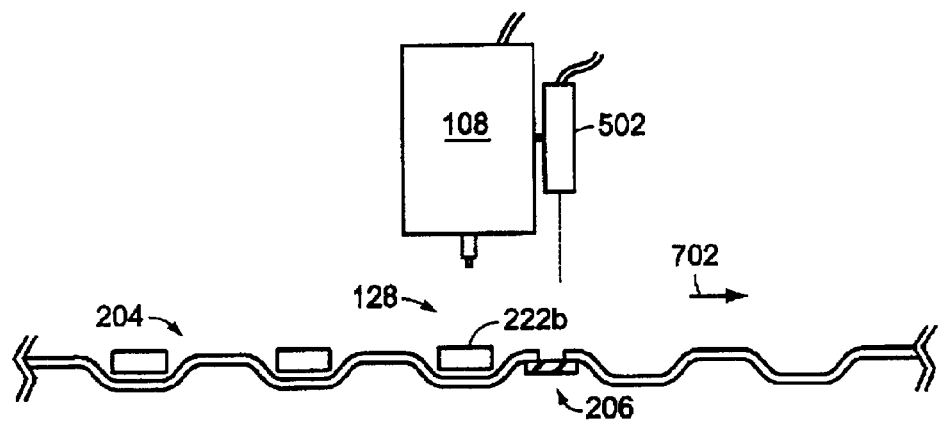
FIGS. 7A through 7C illustrate various configurations of a splice detector secured to a pickup member.
Figure 7B:
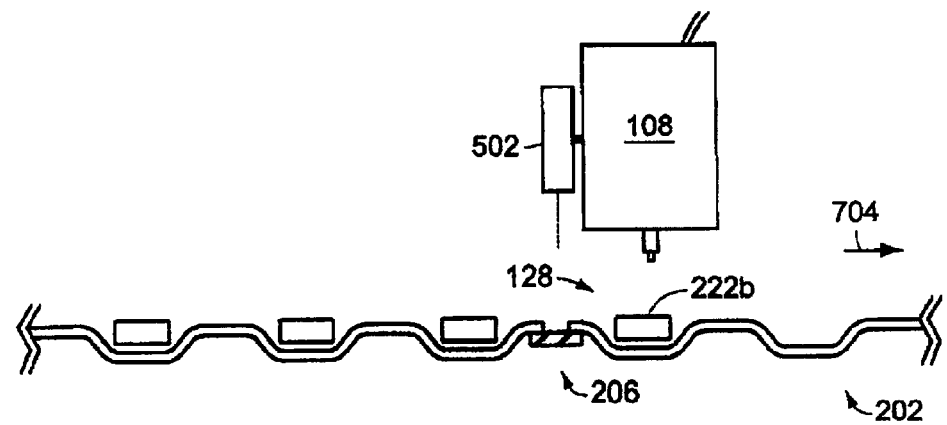
Figure 7C:
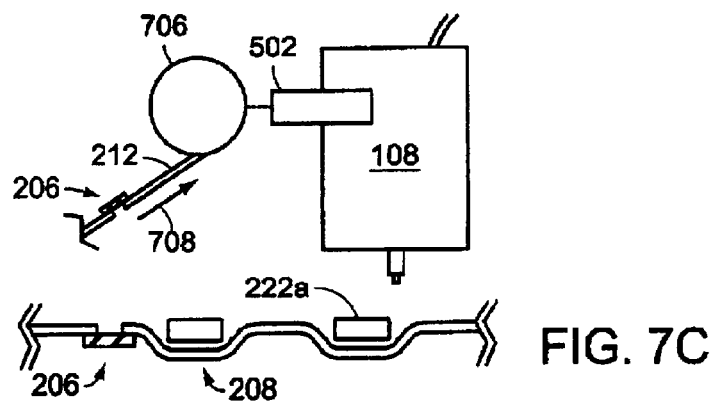

FIGS. 7A through 7C show various orientations of a splice detector 502 secured to a pickup member 108. The first orientation, illustrated in FIG. 7A, depicts the splice detector 502 oriented to scan a portion of the supply tape portion 208 of a component carrier tape that is downstream of the pickup position 128. The arrow 702 indicates the direction of supply tape portion 208 motion. The splice detector 502 is oriented so that it is trained on the splice connection 206 as the pickup member 108 approaches the first available component 222b on the second length 204 of tape. The second orientation, depicted in FIG. 7B, illustrates the splice detector 502 secured to the pickup member 108 to be able to scan an area of the supply tape portion 208 that is upstream of the component 222b being removed by the pickup member 108. The arrow 704 indicates the direction of supply tape motion. In this configuration, the splice connection 206 can be detected as the pickup member 108 is removing the last available component from the first length 106 of tape. The third orientation, depicted in FIG. 7C, illustrates a take-up reel 706, which may be provided on certain feeders or component placement machines to collect the removed cover tape portion 212 after it is removed from a corresponding supply tape portion 208. The direction of the cover tape portion's 212 motion is indicated by arrow 708. The illustration indicates that, conceptually, a splice detector 502 may be secured to a pickup member 108 for motion therewith and may be oriented in such a manner that it scans an associated area of a removed cover tape portion 212 to detect the splice 206. Inspection of the illustration indicates that the splice 206 will be positioned in view of the splice detector 502 when component 222a is positioned to be removed from the supply tape portion by the pickup member 108.

Many of the techniques described herein may be incorporated into an operating program for a component placement machine that manages the operations of the placement machine. Various features of these techniques may be implemented with hardware, software or with a combination of hardware and software. For example, some aspects can be implemented in computer programs executing on programmable computers. Each program can be implemented in a high-level procedural or object-oriented programming language to communicate with a computer system. Furthermore, each of such computer programs can be stored on a storage medium, such as read-only-memory (ROM) readable by a general or special purpose programmable computer, for configuring and operating the computer and corresponding placement machine when the storage medium is read by the computer to perform the functions described above.

Various features of the techniques described herein can be modified. For example, when a splice is detected, the identity of the second reel might be associated to not only the circuit board positioned to receive a component from it, but also a circuit board previously coupled to the machine. Additionally, an association might be created between the original reel and the following circuit board. These techniques and related variations might provide a margin of safety in tracking component placement as will be readily understood by one skilled in the art. Additionally, splice detectors sensitive to material properties not specifically mentioned herein might be used. Additionally, the data collected regarding component traceability might be manipulated in a variety of ways to create reports, etc. The recited exemplary sequences of events described herein may be modified in numerous ways, each of which will be understood by one of skill in the art. Also, many of the steps may be performed either manually or automatically. The processing of data described herein may be accomplished by the local electronic control unit 134, the processing unit 116 or a remote processing unit. Storage of data may also be accomplished at any convenient memory storage device. Of course, the techniques, methods, apparatus', etc. described herein may be adaptable to several different styles of placement machines.

Other embodiments are within the scope of the following claims.

What is claimed is:

1. A method of associating a component source with a destination circuit board in a component placement machine equipped with a component carrier tape having a first length positioned to deliver components for subsequent placement onto the destination circuit board and a second length attached to the first portion by a splice connection, the method comprising:

beginning with the first length of tape, sequentially removing a plurality of components from the component carrier tape for subsequent placement onto a destination circuit board;

scanning a section of the component carrier tape associated with each removed component using a scanner that is responsive to the splice connection and is securely attached to a movable pick-head that is positionable to remove components from the component carrier tape for subsequent placement onto the destination circuit board; and creating an association between the destination circuit board and the second length of tape in response to the scanner responding to the splice connection.

2. The method of claim 1 further comprising determining whether each scanned section of the component carrier tape includes a splice connection.

3. The method of claim 1 further comprising:

placing each removed component on a respective destination circuit board; and wherein each scanned section of the component carrier tape is spaced from all previously scanned sections.

4. The method of claim 1 wherein scanning the section of the component carrier tape comprises using a scanner that is responsive to a color associated with the splice connection.

5. The method of claim 1 wherein scanning the portion of the component carrier tape comprises using a scanner that is responsive to a reflectivity associated with the splice connection.

6. The method of claim 1 wherein scanning the portion of the component carrier tape comprises using a scanner that is responsive to a fluorescence associated with the splice connection.

7. The method of claim 1 wherein scanning the portion of the component carrier tape comprises using a scanner that is responsive to magnetism associated with the splice connection.

8. The method of claim 1 further comprising:

storing identification data associated with the destination circuit board; and storing identification data associated with the second length of tape;

wherein creating the association comprises establishing a link between the stored identification data associated with the destination circuit board and the stored identification data associated with the second length of tape.

9. The method of claim 8 further comprising storing the established link in a memory storage unit.

10. A method of tracking an association between a circuit board assembled with a component placement machine, and a source identity of an electronic component of the circuit board, the method comprising:

coupling a first circuit board to the machine, the first circuit board positioned to receive an electronic component placed by the machine;

mounting a reel on the machine, the reel loaded with a first length of component carrier tape having discrete electronic components mounted thereon;

attaching a leading end of a second length of component carrier tape to a trailing end of the first length of component carrier tape with a splice connection, the second length of component carrier tape also having discrete electronic components mounted thereon;

recording an identity of the first length of component carrier tape;

recording an identity of the second length of component carrier tape;

recording an identity of the first circuit board;

using a movable pick-head to remove a component from the first length of component carrier tape and to place the removed component onto the first circuit board;

associating the recorded identity of the first length of component carrier tape with the recorded identity of the first circuit board;

detecting the splice connection between the first and second lengths of component carrier tape with a scanner that is securely attached to the movable pick-head;

using the movable pick-head to remove a component from the second length of component carrier tape for placement onto the first circuit board; and associating the recorded identity of the second length of component carrier tape with the recorded identity of the first circuit board.

11. The method of claim 10 further comprising:

coupling a second circuit board to the machine, the second circuit board positioned to receive an electronic component placed by the machine;

recording an identity of the second circuit board;

removing a component from the second length of component carrier tape for placement onto the second circuit board; and associating the recorded identity of the second length of component carrier tape to the recorded identity of the second circuit board.

12. The method of claim 10 wherein recording the identity of the first length of component carrier tape occurs before mounting the reel on the machine.

13. The method of claim 10 wherein recording the identity of the second length of component carrier tape occurs before attaching the leading end of the second length of component carrier tape to the trailing end of the first length of component carrier tape.

14. The method of claim 10 wherein recording the identity of the first circuit board is accomplished before coupling the first circuit board to the machine.

15. The method of claim 10 wherein removing the component from the first length of component carrier tape and associating the recorded identity of the first length of component carrier tape with the recorded identity of the first circuit board occurs before attaching the leading end of the second length of component carrier tape to the trailing end of the first length of component carrier tape.

16. The method of claim 10 wherein associating the recorded identity of the second length of component carrier tape with the recorded identity of the first circuit board occurs in response to detecting the splice connection between the first and second lengths of component carrier tape.

17. The method of claim 10 wherein removing the component from the second length of component carrier tape after detecting the splice connection triggers associating the recorded identify of the second length of component carrier tape with the recorded identify of the first circuit board.

18. The method of claim 10 further comprising placing the component removed from the second length of component carrier tape onto the first circuit board, and wherein associating the identity of the second length of component carrier tape with the recorded identity of the first circuit board occurs in response to placing the component.

19. The method of claim 10 further comprising activating an alarm in response to detecting the splice connection prior to recording the identity of the second length of component carrier tape.

20. The method of claim 10 further comprising de-energizing the machine in response to detecting the splice connection prior to recording the identity of the second length of component carrier tape.

21. The method of claim 10 wherein detecting the splice connection comprises using an optical sensing element responsive to color to detect a color associated with the splice connection.

22. The method of claim 10 wherein detecting the splice connection comprises using an optical sensing element responsive to reflectivity to detect a reflectivity associated with the splice connection.

23. The method of claim 10 wherein detecting the splice connection comprises using an optical sensing element responsive to fluorescence to detect a fluorescence associated with the splice connection.

24. The method of claim 10 wherein detecting the splice connection comprises using a sensing element responsive to magnetism to detect a magnetic property associated with the splice connection.

25. The method of claim 1 further comprising:
  removing a second electronic component from a second feeder at a selected second feeder position with the movable pick-head;
  scanning a section of a second component carrier tape associated with the second feeder using the scanner secured to the movable pick-head; and
  determining whether the scanned section of the second component carrier tape associated with the second feeder includes a splice connection.

26. The method of claim 1 further comprising, after scanning the section of the component carrier tape, advancing the component carrier tape.

27. The method of claim 1 further comprising verifying that data stored in an inventory management database is updated in response to the scanner responding to the splice connection.

28. The method of claim 1 further comprising generating a signal to indicate that the scanned section of the component carrier tape includes a splice connection, in response to the scanner responding to the splice connection.

29. The method of claim 28 further comprising incrementing a value stored in a memory device responsive to the generated signal, the stored value indicating the remaining inventory of electronic components available at a selected feeder position.

30. The method of claim 28 further comprising verifying, in response to the generated signal, that component identification data is updated in an inventory control database associated with the component placement machine.

31. The method of claim 30 further comprising de-energizing the component placement machine in response to the generated signal and a determination that component identification data is not updated in the inventory control database.

32. The method of claim 30 further comprising activating an alarm in response to the generated signal and a determination that component identification data is not updated in the inventory control database.

33. The method of claim 1 wherein the scanner comprises an optical sensing element responsive to color, and wherein scanning the section of the component carrier tape comprises detecting a color of the scanned section of the component carrier tape.

34. The method of claim 1 wherein the scanner comprises an optical sensing element responsive to reflectivity, and wherein scanning the section of the component carrier tape comprises detecting reflectivity of the scanned section of the component carrier tape.

35. The method of claim 1 wherein the scanner comprises an optical sensing element responsive to fluorescence, and wherein scanning the section of the component carrier tape comprises detecting fluorescence of the scanned section of the component carrier tape.

36. The method of claim 1 wherein the scanner comprises a sensing element responsive to magnetism, and wherein scanning the section of the component carrier tape comprises detecting a magnetic property associated with the scanned section of the component carrier tape.

37. The method of claim 1 wherein the component carrier tape comprises a base portion and a separable cover portion, and wherein scanning the section of the component carrier tape comprises scanning the base portion.

38. The method of claim 1 wherein the component carrier tape comprises a base portion and a separable cover portion, and wherein scanning the section of the component carrier tape comprises scanning the base portion.

* * * * *